United States Patent [19]

Price

[11] Patent Number: 4,601,063

[45] Date of Patent: Jul. 15, 1986

[54] DOUBLY-BALANCED MIXER TERMINATION

[75] Inventor: Timothy W. Price, Indianapolis, Ind.

[73] Assignee: RCA Corporation, Princeton, N.J.

[21] Appl. No.: 705,499

[22] Filed: Feb. 28, 1985

[51] Int. Cl.$^4$ ............................................. H04B 1/12
[52] U.S. Cl. .................................. 455/317; 455/326; 455/330; 455/338
[58] Field of Search ............... 455/302, 317, 326, 330, 455/332, 333, 323, 325, 338, 339, 311

[56] References Cited

FOREIGN PATENT DOCUMENTS 0008005  1/1978  Japan .................................... 455/330

OTHER PUBLICATIONS

The article entitled "Double Balanced Mixers" appearing on pp. 110–117 of the Anzac RF and Microwave Components catalog for 1984 published by the Anzac Division of Adams-Russell Company, Inc.

The article "Reactive Loads—The Big Mixer Menace" by Peter Will appearing on pp. 38–42 of the magazine Microwave for Apr. 1971.

*Primary Examiner*—Marc E. Bookbinder
*Assistant Examiner*—Andrew Telesz
*Attorney, Agent, or Firm*—Eugene M. Whitacre; Paul J. Rasmussen; Peter M. Emanuel

[57] ABSTRACT

The output of a doubly-balanced mixer of a television tuner is terminated by a network which exhibits the characteristic impedance of the mixer for both the sum and difference frequency components. The difference frequency component termination simply consists of an inductor and a capacitor connected as a series-tuned circuit and a resistive element connected in series between the output of the mixer and signal ground. The inductor and capacitor are selected resonate at a frequency in the passband of the IF section and the resistive element is selected to exhibit the characteristic impedance of the mixer. The sum frequency component termination simply consists of a capacitor and a resistive element connected in series between the output of the mixer and signal ground. The capacitor is selected to exhibit negligible impedance just below the lowest frequency of the sum frequency component and the resistive element is selected to exhibit the characteristic impedance of the mixer.

6 Claims, 3 Drawing Figures

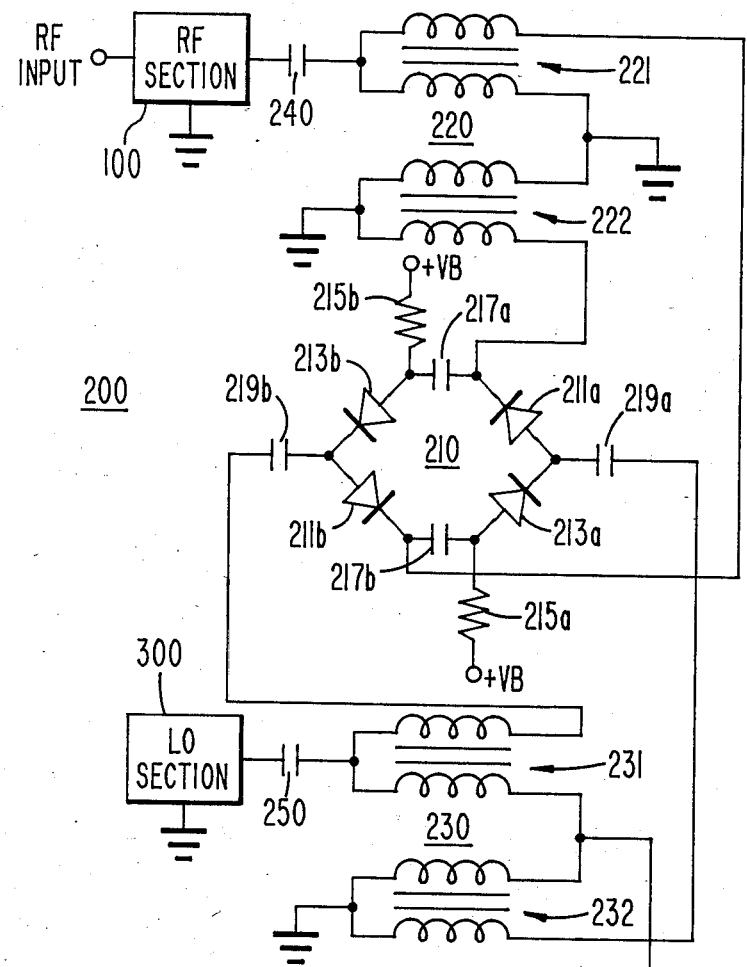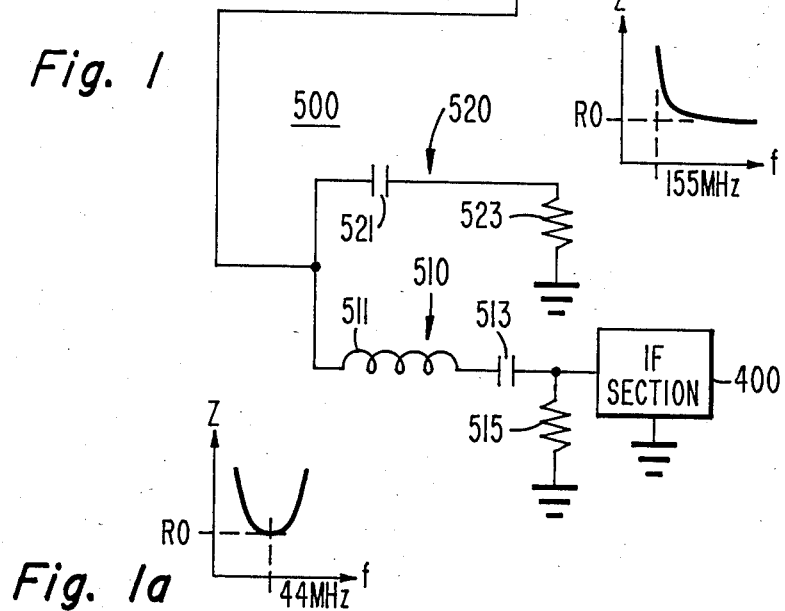
Fig. 1
Fig. 1b
Fig. 1a

DOUBLY-BALANCED MIXER TERMINATION

The present invention concerns a termination arrangement for a doubly-balanced mixer.

DESCRIPTION OF THE PRIOR ART

It is desirable to use a doubly-balanced mixer in a television tuner because of its properties of inhibiting the input signals from reaching the output and of inhibiting the generation of unwanted frequency components. These properties are due to the balanced configuration of a doubly-balanced mixer.

When receiving single ended input signals (i.e., input signals which are referenced to signal ground), a balun for converting a single ended signal to a double ended or differential input signal is provided for each input signal. The output signal of the mixer is usually taken from one of the two baluns. It is desirable to terminate the output of the mixer with the characteristic impedance of the balun in the frequency range of the output signal of the mixer to prevent impedance mismatches which would tend to produce distortion causing unwanted frequency components. More specifically, since the output signal of a mixer contains both sum and difference frequency components, it is desirable to provide a termination network which exhibits the characteristic impedance of the balun for both the sum and difference frequency components. Generally, this requires a relatively complex and therefore expensive network.

SUMMARY OF THE INVENTION

It is herein recognized that for use in a tuner of a television receiver, in which the sum and difference frequency components are very far apart in frequency and the local oscillator is tuned to provide a difference frequency component which is the same for each channel, i.e., always in the nominal IF frequency range, the termination network for a doubly-balanced mixer can have a very simple configuration. Specifically, in accordance with the invention, the termination network simply includes a capacitor and a resistance element having a value substantially equal to the characteristic impedance of the mixer connected in series between the output of the mixer and signal ground for the sum frequency component and an inductor, capacitor and a resistance element having a value substantially equal to the characteristic impedance of the mixer connected in series between the output of the mixer and signal ground for the difference frequency component.

BRIEF DESCRIPTION OF THE DRAWINGS

The invention will be described in greater detail with reference to the accompanying Drawing in which:

FIG. 1 shows the schematic of a preferred embodiment of the present invention; and FIGS. 1a and 1b show graphical representations of impedance characteristics useful in understanding the embodiment shown in FIG. 1.

DETAILED DESCRIPTION OF THE INVENTION

In FIG. 1 there is shown a television tuner for tuning VHF broadcast and cable channels and UHF broadcast channels. By way of example, for use in the United States, the tuner is capable of tuning channels for which the RF picture carrier and local oscillator frequencies are specified in the following table.

| BAND | RF RANGE (MHz) | LO RANGE (MHz) |
|------|----------------|----------------|
| B1   | 55.25–83.25    | 101–129        |
| B2   | 91.25–151.25   | 137–197        |
| B3   | 157.25–265.25  | 203–311        |
| B4   | 271.25–463.25  | 317–509        |
| B5   | 471.25–801.25  | 517–847        |

It will be appreciated that: band B1 corresponds to channels of the low VHF broadcast band (i.e., channels 2–6); band B2 corresponds to channels in a lower portion of the midband cable band; band B3 corresponds to channels in the remaining portion of the midband cable band, channels in the high VHF broadcast band (i.e., channels 7–13) and channels in the lower portion of the superband cable band; band B4 corresponds to channels in the remaining portion of the superband cable band and channels in the hyperband cable band; and band B5 corresponds to channels in the UHF broadcast band (i.e., channels 14–69).

The RF signals received at respective VHF and UHF inputs are coupled to an RF section 100 where the RF signal corresponding to the selected channel is selected and coupled to a mixer. A local oscillator signal having a frequency corresponding to the selected channel produced by a local oscillator section 300 is also coupled to mixer 200. Mixer 200 combines the selected RF signal and the local oscillator signal to produce an output signal having sum and difference frequency components. The output signal of mixer 200 is coupled to an IF section 400. The frequency of the local oscillator signal for each channel is controlled so that the difference frequency component is in the passband of IF section 400 which, for example, in the United States is approximately between 41 and 46 MHz and has sound and picture carrier frequencies at 41.25 MHz and 45.75 MHz, respectively. The conventional tuning control portion of the tuner for controlling the tuning of RF section 100 and local oscillator section 300 in the various bands is not shown.

Mixer 200 is a doubly-balanced mixer including a diode bridge 210 as the mixing element and baluns 220 and 230 for converting the single ended RF and local oscillator signals to respective pairs of differential signals for application to respective pairs of opposite corners of diode bridge 210. Each of baluns 220 and 230 includes two pairs of bifilar wires (221 and 222 and 231 and 232, respectively) wound around a ferrite core and connected in conventional fashion as shown to provide a ¼ impedance transformation between the unbalanced (single ended) input and the balanced (double ended) output. RF section 100 is AC coupled to balun 220 through a capacitor 240. Local oscillator section 300 is AC coupled to balun 230 through capacitor 250. The output signal of mixer 200 is coupled from balun 230 to IF section 400 through termination network 500, to be described in greater detail below.

Bias current for diodes 211a and 213a of diode bridge 210 is provided from a source of positive voltage +VB through a resistor 215a. The return for the bias current is provided by balun 220. Bias current for diodes 211b and 213b of diode bridge 210 is provided through resistor 215b in corresponding fashion. It has been found desirable to bias the diodes in or near saturation for more linear mixer operation.

DC blocking capacitors 217a and 217b, which have negligible impedance in the frequency range of mixer 210, are coupled between diodes 211a and 213b and diodes 211b and 213a, respectively, to DC isolate the two bias current paths. More specifically, capacitor 217a prevents the bias current of diodes 211a and 213a from influencing the bias current of diodes 211b and 213b and also prevents the DC voltage developed at the junction of resistor 215b and diode 213b from being "shorted" to ground through the relatively low DC impedance of winding 221 of balun 220. Capacitor 217b serves in a corresponding manner to capacitor 217a. DC blocking capacitors 219a and 219b, also with negligible impedance in the frequency range of mixer 200, prevent the DC voltages at the junction of diodes 211a and 213a and at the junction of diodes 211b and 213b from being "shorted" to ground through the windings of balun 230.

For optimum operation of doubly-balanced mixer 200 to provide an output signal substantially free of unwanted frequency components, it is desirable that baluns 220 and 230 be terminated in impedances matching those presented by the balun at its inputs and outputs. Thus, if balun 220 and 230 have a given characteristic impedance for the unbalanced configuration, e.g., 50 ohms, it is desirable that RF section 100 and local oscillator section 300 connected to the unbalanced inputs of baluns 220 and 230, respectively, exhibit output impedances substantially equal to the unbalanced characteristic impedance, e.g., 50 ohms, and that diode bridge 210 connected to the balanced output of baluns 220 and 230 exhibit an input impedance substantially equal to four times the unbalanced characteristic impedance, e.g., 200 ohms. The latter is achievable to a good approximation since a typical diode bridge exhibits an input impedance of approximately 200 ohms. For the same reasons as stated above, since the output of mixer 200 is unbalanced, it is desirable that it be terminated in an impedance substantially equal to the unbalanced characteristic impedance of balun 230 throughout the frequency range of the output signal of mixer 200 for both the sum and difference frequency components. This is the purpose of termination network 500.

Termination network 500 includes a difference frequency termination portion 510, coupled between the output of mixer 200 and IF section 400 and a sum signal termination portion 520.

Since the difference frequency component of the output signal of mixer 200 is the same for each channel, i.e., it is always within the passband of IF section 400 due to the tuning of local oscillator section 300, difference frequency component termination portion 510 simply includes a series tuned circuit, consisting of an inductor 511 and a capacitor 513 resonant at a frequency substantially equal to the center frequency, e.g., 44 MHz, of the passband of IF section 400, and a resistor 515 having a resistance (RO) substantially equal to the unbalanced characteristic impedance of balun 230 connected in series between the output of mixer 200 and signal ground. The input of IF section 400 is connected to the junction of the tuned circuit and resistor 515. This arrangement exhibits the impedance characteristic shown in FIG. 1a. It is noted that resistor 515 may comprise the input impedance of IF section 400. The series tuned circuit not only establishes (together with resistor 515) the desired termination for the difference frequency component, but also prevents the sum and other unwanted frequency components from reaching IF section 400.

Since the lowest sum frequency component of the output signal of mixer 200 is approximately 155 MHz, i.e., the sum of the frequency of the lowest sideband component of the RF picture carrier and the frequency of the local oscillator signal for channel 2, and that is more than 99 MHz from the highest sideband component of the IF picture carrier, sum frequency component termination portion 520 simply includes a capacitor 521 and a resistor 523 having a resistance (RO) substantially equal to the unbalanced characteristic impedance of balun 230 connected in series between the output of mixer 200 and signal ground. Capacitor 521 is selected to isolate resistance 523 from difference frequency component termination portion 510 for frequencies below the lowest sum frequency and to have insignificant impedance at frequencies above the lowest sum frequency so as to provide the impedance characteristic shown in FIG. 1b.

It will be appreciated that modifications can be made to the preferred embodiment. For example, the order of resistor 521 and capacitor 523 in sum frequency component termination portion 520 may be interchanged. Furthermore, if the input impedance of IF section 400 is very high, the input of IF section 400 may be directly coupled to the output of mixer 200 instead of the junction of the tuned circuit and resistor 515 of difference frequency component termination portion 510. In the latter case the order of the elements in difference frequency component termination portion 510 is not important, however, the filtering provided by the tuned circuit in the configuration shown on longer exists. Furthermore, if the use of a single resistive termination element is desired, resistor 523 may be eliminated and capacitor 521 may then be connected in parallel with the series connection of inductor 511 and capacitor 513. These and other modifications are contemplated to be within the scope of the present invention defined by the following claims.

What is claimed is:

1. A tuner for receiver comprising:
an input for receiving RF signals corresponding to various channels;
RF means for selecting the RF signal corresponding to a selected channel;
local oscillator means for generating a local oscillator signal having a frequency corresponding to the selected channel;
mixer means for combining said selected RF signal and said local oscillator signal to produce an output signal at an output having sum and difference frequency components;
IF means having an input coupled to the output of said mixer means and having a predetermined passband;
said local oscillator signal being controlled so that said difference frequency component is within said passband;
sum frequency component termination means coupled to said output of said mixer means for terminating said output of said mixer substantially in its characteristic impedance including a capacitor and a resistance element connected in series between said output of said mixer and a point of reference potential, said resistance element having a resistance value substantially equal to that of said characteristic impedance of said mixer, said capacitance having a value such that it has a negligible impedance in the frequency range between the highest frequency of said difference frequency component and the lowest frequency of said sum frequency component; and difference frequency component termination means for terminating said output of said mixer substantially in its characteristic impedance including an inductor and a capacitor and a resistance element coupled in series between said output of said mixer and said point of reference potential, said resistance element having a resistance value substantially equal to that of said characteristic impedance of said mixer, said series coupling of the said inductor and said capacitor forming a tuned circuit having a resonance at a frequency within said passband of said IF means.

2. The tuner recited in claim 1, wherein:
said RF means, said local oscillator means and said IF means are adapted for tuning television signals.

3. The tuner recited in claim 1, wherein:
said inductor and said capacitor of said difference frequency component terminating means are connected in series between said output of said mixer means and said input of said IF means.

4. The tuner recited in claim 3, wherein:
said resistance element of said difference frequency component terminating means comprises the input impedance of said IF means.

5. The tuner recited in claim 1, wherein:
said capacitor of said sum frequency component terminating means has a value such that it has negligible impedance just below the lowest frequency of said sum frequency component.

6. The tuner recited in claim 1, wherein:
said mixer is a doubly-balanced mixer.

* * * * *